(12) United States Patent
Lin

(10) Patent No.: US 10,096,996 B1
(45) Date of Patent: Oct. 9, 2018

(54) KINETIC ENERGY POWER BANK

(71) Applicant: Shiliang Lin, Guangdong (CN)

(72) Inventor: Shiliang Lin, Guangdong (CN)

( * ) Notice: Subject to any disclaimer, the term of this patent is extended or adjusted under 35 U.S.C. 154(b) by 0 days.

(21) Appl. No.: 15/808,897

(22) Filed: Nov. 10, 2017

(51) Int. Cl.
| | |
|---|---|
| *H02K 35/00* | (2006.01) |
| *H02J 1/00* | (2006.01) |
| *H05K 5/02* | (2006.01) |
| *H05K 5/03* | (2006.01) |
| *H05K 5/00* | (2006.01) |
| *H02J 7/00* | (2006.01) |
| *H05K 1/18* | (2006.01) |
| *H05K 7/14* | (2006.01) |

(52) U.S. Cl.
CPC .............. *H02J 1/00* (2013.01); *H02J 7/0052* (2013.01); *H05K 5/0086* (2013.01); *H05K 5/0247* (2013.01); *H05K 5/03* (2013.01); *H02J 2007/0062* (2013.01); *H02K 35/00* (2013.01); *H05K 1/181* (2013.01); *H05K 5/0017* (2013.01); *H05K 7/1427* (2013.01); *H05K 2201/10015* (2013.01); *H05K 2201/10037* (2013.01); *H05K 2201/10174* (2013.01)

(58) Field of Classification Search
CPC ..................................................... H02K 35/00
See application file for complete search history.

(56) References Cited

U.S. PATENT DOCUMENTS 9,780,633 B2 * 10/2017 Shastry .................. H02K 35/02

* cited by examiner

*Primary Examiner* — Daniel Cavallari

(57) ABSTRACT

The present utility model discloses a kinetic energy power bank, comprising a housing, a power generation device, a circuit board, and an energy storage battery. The circuit board is connected to the power generation device. The power generation device has a magnet and a conductive coil disposed therein. In the present utility model, the design of an energy conversion circuit and a layout structure inside the housing is optimized. In this way, the structure of the circuit becomes simpler, costs and electric energy loss are reduced, and the energy conversion rate is higher. Besides, the problem that normal operation of the device is affected due to element interference with each other and thermal energy accumulation is resolved.

6 Claims, 3 Drawing Sheets

KINETIC ENERGY POWER BANK

BACKGROUND OF THE INVENTION

The present utility model relates to the technical field of mobile charging devices, and in particular to a kinetic energy power bank that generates electric energy through walking.

As intelligent electronic products such as mobile phones and tablets develop rapidly and become popular, these intelligent electronic products play an increasingly important role in the modern life. However, one common shortcoming that current electronic products still have is batteries. A battery, even one made by a leading manufacturer in the industry, has an endurance of only about two days, which is far inadequate to meet people's actual requirements. To prevent the use of smartphones from being affected for the reason that batteries run out of power, many users carry a power bank (that is, a portable power source). However, most existing power banks can be used only after being charged by using a fixed power source. If a power bank is not charged in time or is inadequately charged, the use by a user is still affected. Therefore, someone invented a power bank that can generate power itself as a carrier is walking. A self-generating device built in the power bank makes use of constant changing of a magnetic field of a magnet during movement to enable a conductive coil to generate a current and store the current in a battery. This resolves a problem that a power bank requires to be fully charged at any time, thereby greatly facilitating the use by a user. However, as a current walking power generation power bank is not sufficiently scientific and reasonable in terms of circuit design, etc, and is excessively complex, an electric energy conversion rate can reach only 60% to 70%, and a fast charging effect cannot be achieved.

BRIEF SUMMARY OF THE INVENTION

In view of disadvantages that exist in the prior art, the present utility model provides a kinetic energy power bank that has a more reasonable circuit structure and design and a higher electric energy conversion rate.

To resolve the foregoing technical problem, the following technical solution is adopted in the present utility model: A kinetic energy power bank includes a housing, a power generation device, a circuit board, and an energy storage battery, wherein the power generation device, the circuit board, and the energy storage battery are installed in the housing, the circuit board is connected to the power generation device, the energy storage battery is connected to the circuit board, the power generation device has a magnet and a conductive coil; and characterized in that circuits on the circuit board include an input rectifier circuit, an energy storage circuit, and a (DC-DC) boost output circuit, wherein the input rectifier circuit is a bridge rectifier circuit formed of eight diodes D2 to D9, and the input rectifier circuit is connected to the conductive coil of the power generation device; the energy storage circuit is connected to an output terminal of the input rectifier circuit and includes an inductor L1 and a capacitor C2, the capacitor C2 being connected across two output terminals of the input rectifier circuit, one end of the inductor L1 being connected to the capacitor C2 and one end of the input rectifier circuit, and the capacitor C2 being connected to two energy storage batteries; and the boost output circuit is connected to the energy storage circuit and includes a boost control chip U1 and a unidirectional isolation diode D1, a positive electrode of the diode D1 being connected to an LX pin of the boost control chip U1, the LX pin of the boost control chip U1 being connected to the inductor L1 of the energy storage circuit, a GND pin of the boost control chip U1 being connected between the capacitor C2 of the energy storage circuit and one energy storage battery, and an OUT pin of the boost control chip U1 being connected to a positive output terminal VOUT+, and a positive output terminal VOUT- being connected to the GND pin.

Further, a model of the boost control chip U1 is SC1890E50E, the OUT pin of the boost control chip U1 is connected to a negative electrode of the diode D1, and a filter capacitor C1 is connected between the positive output terminal VOUT+ and the positive output terminal VOUT-.

The power generation device collects kinetic energy in movement. A constantly changing magnetic field enables the conductive coil to generate storable electric energy. An input voltage is rectified and filtered by the input rectifier circuit and reaches a DC-DC boost circuit through the energy storage circuit, where the input voltage is boosted and then output to charge a battery, thereby achieving the objective of converting mechanical energy into electric energy and storing electric energy in a battery at the same time for subsequent use.

Further, the housing includes a bottom cover and a top cover. The power generation device, the circuit board, and the energy storage battery are all installed in the bottom cover, and two 18650 batteries are provided as the energy storage battery, which may store more electric energy. A charging interface corresponding to an output terminal of the boost output circuit is disposed at one end of the bottom cover, and the charging interface includes a standard USB interface and a Micro-USB interface, so as to facilitate different interface requirements.

Further, a power display control board is disposed on one side of the bottom cover, and the power display control board is connected to the energy storage circuit. Several power indicator lamps are disposed on the power display control board, and the power indicator lamps are exposed from a side board of the bottom cover.

Further, an emergency light is disposed at one end of the bottom cover, an LED lamp is used as the emergency light for convenient use in darkness, and a switch of the emergency light is disposed on a side surface of the bottom cover.

Further, several compartments are disposed in the bottom cover, the energy storage battery is disposed in a compartment near the charging interface, the power generation device is disposed in a compartment far away from one end of the charging interface, and the circuit board is fixed between the power generation device and the energy storage battery. In this way, elements are separated by the compartments, so that not only the interior of the power bank is neater, but also mutual interference can be avoided and accumulation of thermal energy can further be prevented, thereby improving the reliability of the power bank.

In the present utility model, the design of an energy conversion circuit and a layout structure inside the housing is optimized. In this way, firstly, the structure of the circuit becomes simpler, costs and electric energy loss are reduced, and the energy conversion rate is higher and exceeds 90%. Secondly, the reasonability of the internal structure of the device is improved, and a problem that normal operation of the device is affected due to element interference with each other and thermal energy accumulation is resolved.

Figure 1:
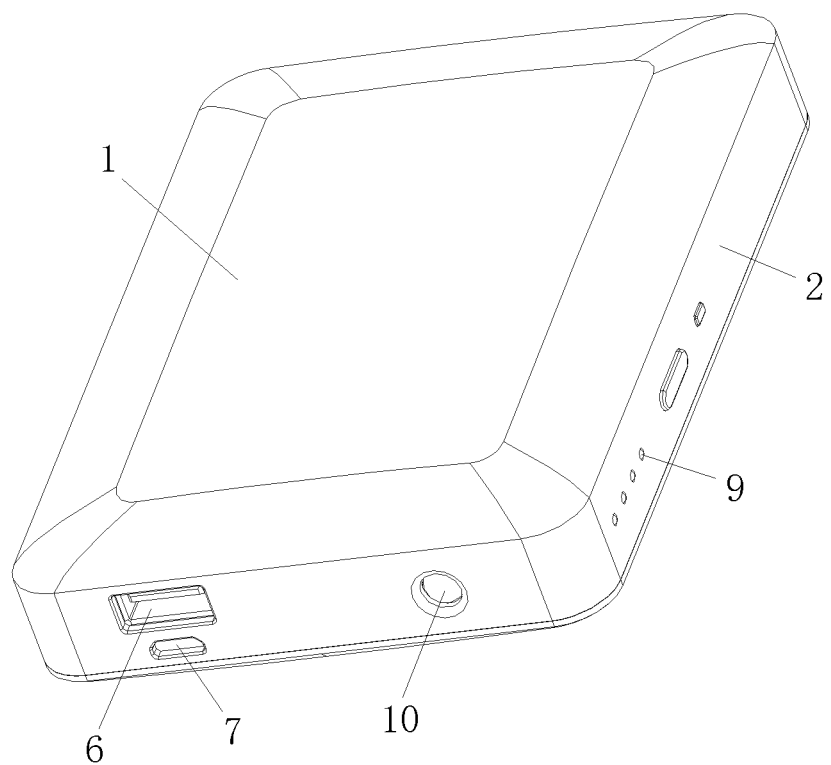
FIG. 1 is a three-dimensional schematic structural diagram according to the present utility model.

In the drawings, 1 bottom cover, 2 top cover, 3 power generation device, 4 circuit board, 5 is an energy storage battery, 6 standard USB interface, 7 Micro-USB interface, 8 power display control board, 9 power indicator lamp, 10 emergency light, A input rectifier circuit, B energy storage circuit, and C boost output circuit.

DETAILED DESCRIPTION OF THE INVENTION

Figure 2:
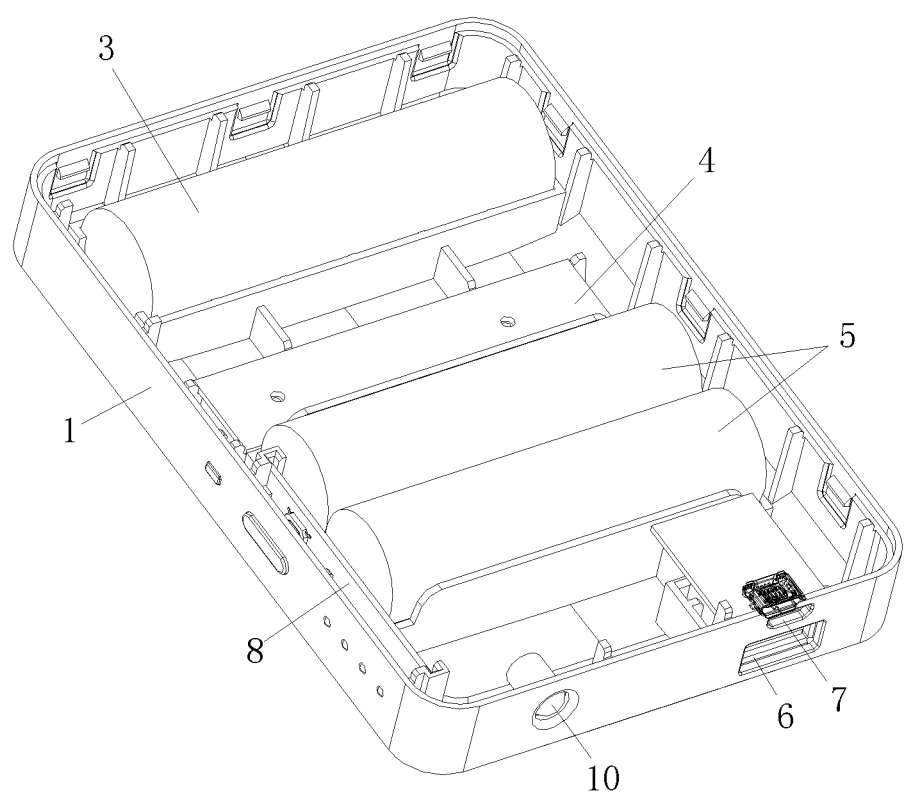
FIG. 2 is an internal schematic structural diagram of the present utility model.
Figure 3:
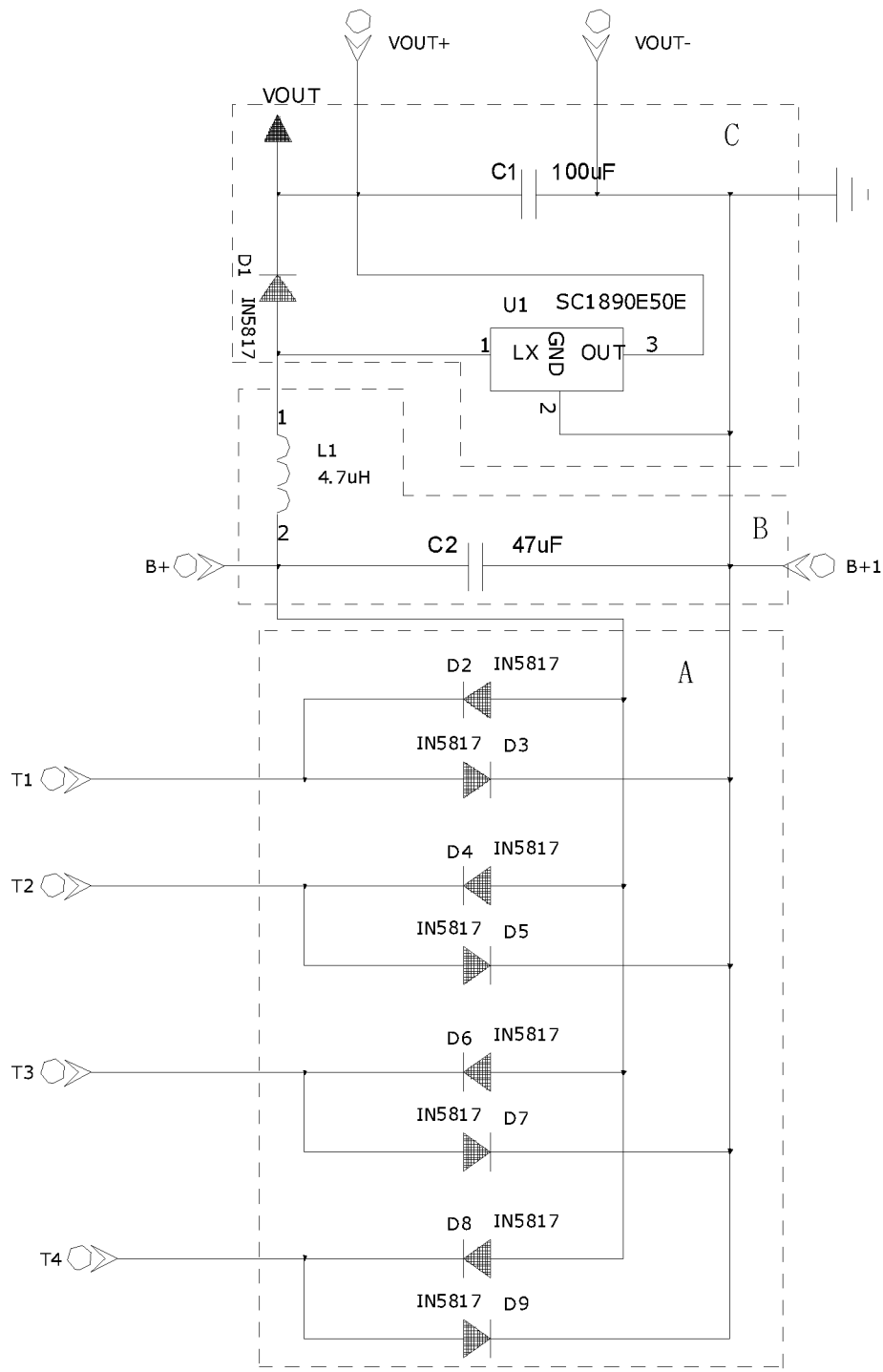
FIG. 3 is a circuit principle diagram according to the present utility model.

In this embodiment, referring to FIGS. 1, 2 and 3, a kinetic energy power bank includes a housing, a power generation device 3, a circuit board 4, and an energy storage battery 5. The power generation device 3, the circuit board 4, and the energy storage battery 5 are installed in the housing. The circuit board 4 is connected to the power generation device 3. The energy storage battery 5 is connected to the circuit board 4. The power generation device 3 has a magnet and a conductive coil (not shown) disposed therein. Circuits on the circuit board 4 include an input rectifier circuit A, an energy storage circuit B, and a (DC-DC) boost output circuit C. The input rectifier circuit A is a bridge rectifier circuit formed of eight diodes D2 to D9. The input rectifier circuit A is connected to the conductive coil of the power generation device 3. The energy storage circuit B is connected to an output terminal of the input rectifier circuit A and includes an inductor L1 and a capacitor C2. The capacitor C2 is connected across two output terminals of the input rectifier circuit. One end of the inductor L1 is connected to the capacitor C2 and one end of the input rectifier circuit. The capacitor C2 is connected to two energy storage batteries. The boost output circuit C is connected to the energy storage circuit B and includes a boost control chip U1 and a unidirectional isolation diode D1. A positive electrode of the diode D1 is connected to an LX pin of the boost control chip U1. The LX pin of the boost control chip U1 is connected to the inductor L1 of the energy storage circuit B. A GND pin of the boost control chip U1 is connected between the capacitor C2 of the energy storage circuit B and one energy storage battery 5. An OUT pin of the boost control chip U1 is connected to a positive output terminal VOUT+. A positive output terminal VOUT- is connected to the GND pin.

A model of the boost control chip U1 is SC1890E50E. The OUT pin of the boost control chip U1 is connected to a negative electrode of the diode D1. A filter capacitor C1 is connected between the positive output terminal VOUT+ and the positive output terminal VOUT-.

The power generation device 3 collects kinetic energy in movement. A constantly changing magnetic field enables the conductive coil to generate storable electric energy. An input voltage is rectified and filtered by the input rectifier circuit A and reaches a DC-DC boost circuit through the energy storage circuit B, where the input voltage is boosted and then output to charge a battery, thereby achieving the objective of converting mechanical energy into electric energy and storing electric energy in a battery at the same time for subsequent use.

The housing includes a bottom cover 1 and a top cover 2. The power generation device 3, the circuit board 4, and the energy storage battery 5 are all installed in the bottom cover 1. Two 18650 batteries are provided as the energy storage battery 5, which may store more electric energy. A charging interface corresponding to an output terminal of the boost output circuit C is disposed at one end of the bottom cover. The charging interface includes a standard USB interface 6 and a Micro-USB interface 7, so as to facilitate different interface requirements.

A power display control board 8 is disposed on one side of the bottom cover 1. The power display control board 8 is connected to the energy storage circuit B. Several power indicator lamps 9 are disposed on the power display control board 8, and the power indicator lamps 9 are exposed from a side board of the bottom cover 1.

An emergency light 10 is disposed at one end of the bottom cover 1. An LED lamp is used as the emergency light for convenient use in darkness. A switch of the emergency light 10 is disposed on a side surface of the bottom cover 1.

Several compartments are disposed in the bottom cover 1. The energy storage battery 5 is disposed in a compartment near the charging interface. The power generation device 3 is disposed in a compartment far away from one end of the charging interface. The circuit board 4 is fixed between the power generation device 3 and the energy storage battery 5. In this way, elements are separated by the compartments, so that not only the interior of the power bank is neater, but also mutual interference can be avoided and accumulation of thermal energy can further be prevented, thereby improving the reliability of the power bank.

The present utility model is described above in detail. The foregoing description provides only preferred embodiments of the present utility model and is not intended to limit the implementation scope of the present utility model. All equivalent changes and modifications made in accordance with the scope of this application shall all fall within the scope of the present utility model.

What is claimed is:

1. A kinetic energy power bank, comprising a housing, a power generation device, a circuit board, and an energy storage battery, wherein the power generation device, the circuit board, and the energy storage battery are installed in the housing, the circuit board is connected to the power generation device, the energy storage battery is connected to the circuit board, the power generation device has a magnet and a conductive coil disposed therein, circuits on the circuit board comprise an input rectifier circuit, an energy storage circuit, and a boost output circuit, the input rectifier circuit is a bridge rectifier circuit formed of eight diodes D2 to D9, and the input rectifier circuit is connected to the conductive coil of the power generation device; the energy storage circuit is connected to an output terminal of the input rectifier circuit, and comprises an inductor L1 and a capacitor C2, the capacitor C2 is connected across two output terminals of the input rectifier circuit, one end of the inductor L1 is connected to the capacitor C2 and one end of the input rectifier circuit, and the capacitor C2 is connected to two energy storage batteries; and the boost output circuit is connected to the energy storage circuit and comprises a boost control chip U1 and a unidirectional isolation diode D1, a positive electrode of the diode D1 is connected to an LX pin of the boost control chip U1, the LX pin of the boost control chip U1 is connected to the inductor L1 of the energy storage circuit, a GND pin of the boost control chip U1 is connected between the capacitor C2 of the energy storage circuit and one energy storage battery, an OUT pin of the boost control chip U1 is connected to a positive output terminal VOUT+, and a positive output terminal VOUT- is connected to the GND pin.

2. The kinetic energy power bank according to claim 1, wherein a model of the boost control chip U1 is SC1890E50E, the OUT pin of the boost control chip U1 is connected to a negative electrode of the diode D1, and a filter capacitor C1 is connected between the positive output terminal VOUT+ and the positive output terminal VOUT-.

3. The kinetic energy power bank according to claim 1, wherein the housing comprises a bottom cover and a top cover, the power generation device, the circuit board, and the energy storage battery are all installed in the bottom cover, and two 18650 batteries are provided as the energy storage battery; and a charging interface corresponding to an output terminal of the boost output circuit is disposed at one end of the bottom cover, and the charging interface comprises a standard USB interface and a Micro-USB interface.

4. The kinetic energy power bank according to claim 3, wherein a power display control board is disposed on one side of the bottom cover, and the power display control board is connected to the energy storage circuit; and several power indicator lamps are disposed on the power display control board, and the power indicator lamps are exposed from a side board of the bottom cover.

5. The kinetic energy power bank according to claim 3, wherein an emergency light is disposed at one end of the bottom cover, an LED lamp is used as the emergency light, and a switch of the emergency light is disposed on a side surface of the bottom cover.

6. The kinetic energy power bank according to claim 3, wherein several compartments are disposed in the bottom cover, the energy storage battery is disposed in a compartment near the charging interface, the power generation device is disposed in a compartment far away from one end of the charging interface, and the circuit board is fixed between the power generation device and the energy storage battery.

\* \* \* \* \*